(12) United States Patent
Katoh

(10) Patent No.: US 6,218,868 B1
(45) Date of Patent: Apr. 17, 2001

(54) PHASE COMPARATOR

(75) Inventor: Shun-ichi Katoh, Yamatokoriyama (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 09/364,293

(22) Filed: Jul. 30, 1999

(30) Foreign Application Priority Data

Jul. 30, 1998 (JP) ................................................ 10-216165

(51) Int. Cl.$^7$ .................................................. H03D 13/00
(52) U.S. Cl. ................................. 327/12; 327/3; 375/373
(58) Field of Search ................................. 327/2, 12, 157, 327/147, 3; 375/373

(56) References Cited

U.S. PATENT DOCUMENTS 4,835,486 * 5/1989 Somerville ............................ 327/335
5,233,636 * 8/1993 Lee et al. ................................ 327/12

FOREIGN PATENT DOCUMENTS 4234226    8/1992 (JP) .

* cited by examiner

Primary Examiner—Dinh T. Le

(57) ABSTRACT

A phase comparator that is configured with a fewer number of gates in an ECL circuit configuration as compared to conventional phase comparator circuits. The phase comparator also operates with lower current consumption, and can achieve a suitable detection of small phase difference by substantially suppressing the influence of spike noises which may arise in the signals input to the phase comparator.

10 Claims, 5 Drawing Sheets

| Qn | H | L | Qn-1 | H |
| QnB | L | H | Qn-1B | H |
| S | H | L | L | H |
| R | L | H | L | H |

PHASE COMPARATOR

BACKGROUND OF THE INVENTION

(1) Field of the Invention

The present invention relates to a phase comparator which is suitable for detecting small phase differences of high-speed pulses used in, for example, tracking correction of optical discs, by suppressing the influence of spike noises occurring in the signals as much as possible.

(2) Description of the Prior Art

Phase comparators have been used in various fields, such as PLL-circuits or various other fields in which a phase comparison result is used for control. The simplest way of configuring a phase comparator is direct use of an exclusive-OR (EX-OR). However, this configuration provides only the phase difference, without any information of phase lead and phase lag. To overcome this, Japanese Patent Application Laid-Open Hei 4 No.234226, proposed a comparator which outputs phase lead and phase lag, independently by detecting leading edges of pulses using flip-flops having an edge-triggered property, as shown in the circuit diagram of this publication.

FIG. 1 shows the circuit diagram of this conventional phase comparator.

FF601 and FF602 are leading-edge triggered D-type flip-flops while FF603 and FF604 are trailing-edge triggered D-type flip-flops. G601 and G602 are AND gates while G603 and G604 are NOR gates.

The D-inputs of all the flip-flops are connected to a power source. The clock inputs to FF601 and FF603 are connected to a lead-phase input terminal Inlead 6 while the clock inputs to FF602 and FF604 are lag-phase input terminal Inlag6. The reset inputs to FF601 and FF602 are connected to the output from G601 while the reset inputs to FF603 and FF604 are connected to the output from G602. The inputs to G601 are the outputs Q601 and Q602 from FF601 and FF602, respectively. The inputs to G602 are the outputs Q603 and Q604 from FF603 and FF604, respectively. The inputs to G603 are the outputs Q601 and Q603 from FF601 and FF603, respectively. The inputs to G604 are connected to the outputs Q602 and Q604 from FF602 and FF604, respectively. The output from G603 is connected to a phase lead output terminal OUTlead6 while the output from G604 is connected to a phase lag output terminal OUTlag6.

In the case where input signal Inlead6 leads input signal Inlag6, upon first transitions (leading edge) of the input signals, the Q-output from FF601 becomes 'H' during only the time (phase difference) between the two first transitions (leading edge). Upon second transitions (trailing edge) of the input signals, the Q-output from FF603 becomes 'H' during only the time between the two second transitions (trailing edge). Similarly, in the case where input signal Inlead6 lags behind input signal Inlag6, the Q-output from FF602 becomes 'H' upon first transitions (leading edge) of the input signals and the Q-output from FF604 becomes 'H' upon second transitions (trailing edge) of the input signals. Accordingly, when input signal Inlead6 leads input signal Inlag6, output signal OUTlead6 becomes 'L' during only the time of phase difference between two first transitions (leading edge) of the input signals and during only the time of phase difference between two second transitions (trailing edge) of them. When input signal Inlead6 lags behind input signal Inlag6, output signal OUTlag6 becomes 'L' during only the time of phase difference between two first transitions (leading edge) of the input signals and during only the time of phase difference between two second transitions (trailing edge) of them.

CMOS circuits need less current consumption, but produce the problem of a large signal delay. So, ECL circuits have been used in the fields where high-speed operations are needed, though the current consumption is high. A leading-edge triggered flip-flop is configured of six gates as shown in FIG. 2. Therefore, the phase comparator shown in FIG. 1 is composed of many gates, that is, twenty-four NAND gates, two AND gates and two NOR gates. If this phase comparator is constructed of ECL circuits, the current consumption for the whole circuit amounts to as much as the current for twenty-eight units of the gate driving current for one gate, so a considerably high current consumption is needed.

When flip-flops having an edge-triggered property are used, if a spike noise arises on the input signal to be edge triggered, it can readily cause malfunction because of the circuit's inherent features. Referring to the timing chart shown in FIG. 3, for example, If a spike noise 1 arises and is input to input terminal Inlag6 during interval t1 to t2, the positive logic, output pulse width PW1 from Q601 is shortened as shown in the chart (the output pulse width PW2 from OUTlead6 is also shortened). Since most phase difference comparators operate by integrating the output pulses, this will not cause fatal influence if a single pulse only is shorted in its pulse width by a spike noise.

However, if, for example, a spike noise 2 arises and input to input terminal Inlag6 during interval t4 to t5, there is a fear that the positive logic, output pulse width PW3 from Q602 might become markedly longer than the original pulse width PW as shown in the chart (the output pulse width PW4 from OUTlag6 also becomes long). In the case where the output is integrated, extremely long pulse widths as in this case produce an erroneous integral.

SUMMARY OF THE INVENTION

It is therefore an object of the present invention to provide a phase comparator which can be configured with a fewer number of gates of ECL circuits, and which can operate with lower current consumption to achieve suitable detection of a small phase difference, by suppressing the influence of spike noises arising in the signals as much as possible.

In accordance with the first aspect of the invention, a phase comparator includes:

an RS flip-flop having a set input terminal receiving a first input signal and a reset input terminal receiving an inverted signal of a second input signal, and producing non-inverse and inverse outputs, wherein only when the first input signal and the inverted signal of the second input signal are both 'true' (i.e., the same state), the non-inverse output and the inverse output become 'true' as well;

a first exclusive-OR circuit receiving the first input signal and the non-inverse output; and a second exclusive-OR circuit receiving the inverted signal of the second input signal and the inverse output.

In accordance with the second aspect of the invention, a phase comparator includes:

a first RS flip-flop having a set input terminal receiving an inverted signal of a first input signal and a reset input terminal receiving a second input signal, and producing first non-inverse and inverse outputs, wherein only when the inverted signal of the first input signal and the second input signal are both 'true' (i.e., the same state), the first non-inverse output and the first inverse output become 'true' as well;

a first exclusive-OR circuit receiving the inverted signal of the first input signal and the first non-inverse output;

a second exclusive-OR circuit receiving the second input signal and the first inverse output;

a second RS flip-flop having a set input terminal receiving a first input signal and a reset input terminal receiving the inverted signal of a second input signal, and producing second non-inverse and second inverse outputs, wherein only when the first input signal and the inverted signal of the second input signal are both 'true', the second non-inverse output and the second inverse output become 'true';

a third exclusive-OR circuit receiving the first input signal and the second non-inverse output;

a fourth exclusive-OR circuit receiving the inverted signal of the second input signal and the second inverse output;

a first OR circuit receiving an output from the first exclusive-OR circuit and an output from the third exclusive-OR circuit; and, a second OR circuit receiving an output from the second exclusive-OR circuit and an output from the fourth exclusive-OR circuit.

In accordance with the third aspect of the invention, the phase comparator having above first or second feature is characterized in that the circuit uses ECL circuit configurations.

According to the first configuration, when the RS flip-flop having no edge triggered property receives 'true' inputs (inputs having the same state) at both the input terminals, it outputs 'true' from the two output terminals. Therefore, upon the second transition of the input signal, only during the first input signal leading the second input signal, the first exclusive-OR circuit will produce a phase difference output of 'true'. Upon the first transition (leading edge) of the input signal, only during the first input signal lagging behind the second input signal, the second exclusive-OR circuit will produce a phase difference output of 'true'.

According to the second configuration, upon the first transition of the input signals, only during the first input signal leading the second input signal, the first exclusive-OR circuit will produce a phase difference output of 'true', while only during the first input signal lagging behind the second input signal, the fourth. exclusive-OR circuit will produce a phase difference output of 'true'. Upon the second transition (trailing edge) of the input signals, only during the first input signal leading the second input signal, the third exclusive-OR circuit will produce a phase difference output of 'true', while only during the first input signal lagging behind the second input signal, the second exclusive-OR circuit will produce a phase difference output of 'true'. The output from the first exclusive-OR circuit and the output from the third exclusive-OR circuit are input to the first OR circuit while the output from the second exclusive-OR circuit and the output from the fourth exclusive-OR circuit are input to the second OR circuit. When the first input signal leads the second input signal, the first OR circuit will produce a 'true' output during a phase difference occurring between them whatever the pulses are on leading edge or trailing edge. When the first input signal lags behind the second input signal, the output from the second OR circuit will be 'true' in a similar manner.

DESCRIPTION OF THE PREFERRED EMBODIMENT

The embodiment of the invention will hereinafter be described in detail with reference to the accompanying drawings.

Figure 1:
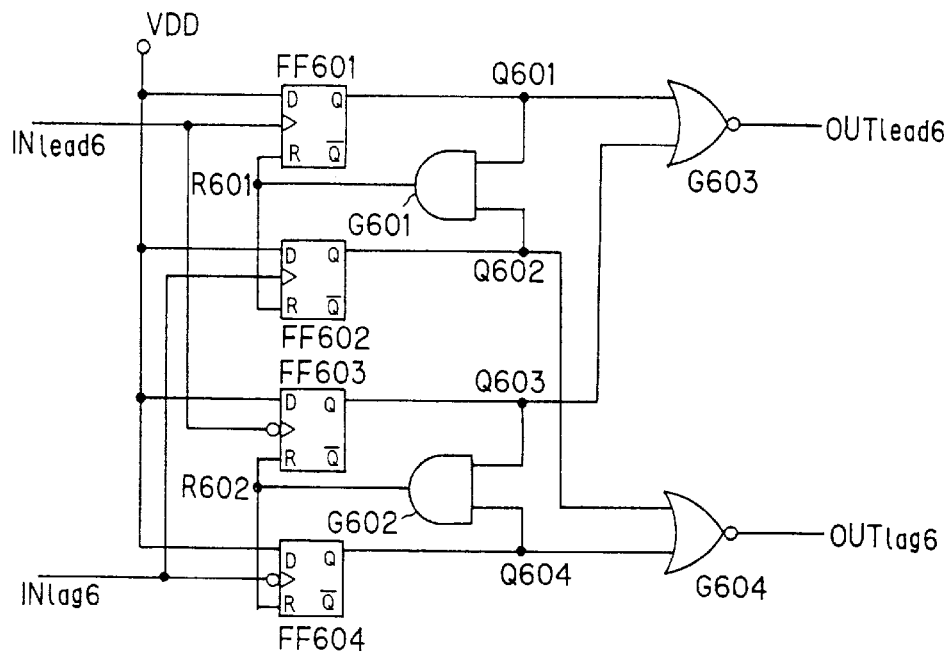
FIG. 1 is a circuit diagram showing a conventional phase comparator.
Figure 2:
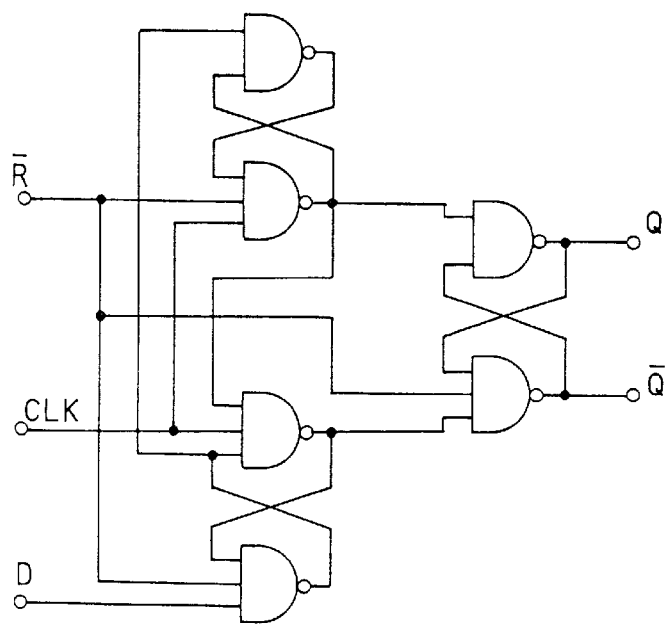
FIG. 2 is circuit diagram showing a leading-edge triggered D-type flip-flop.
Figure 3:
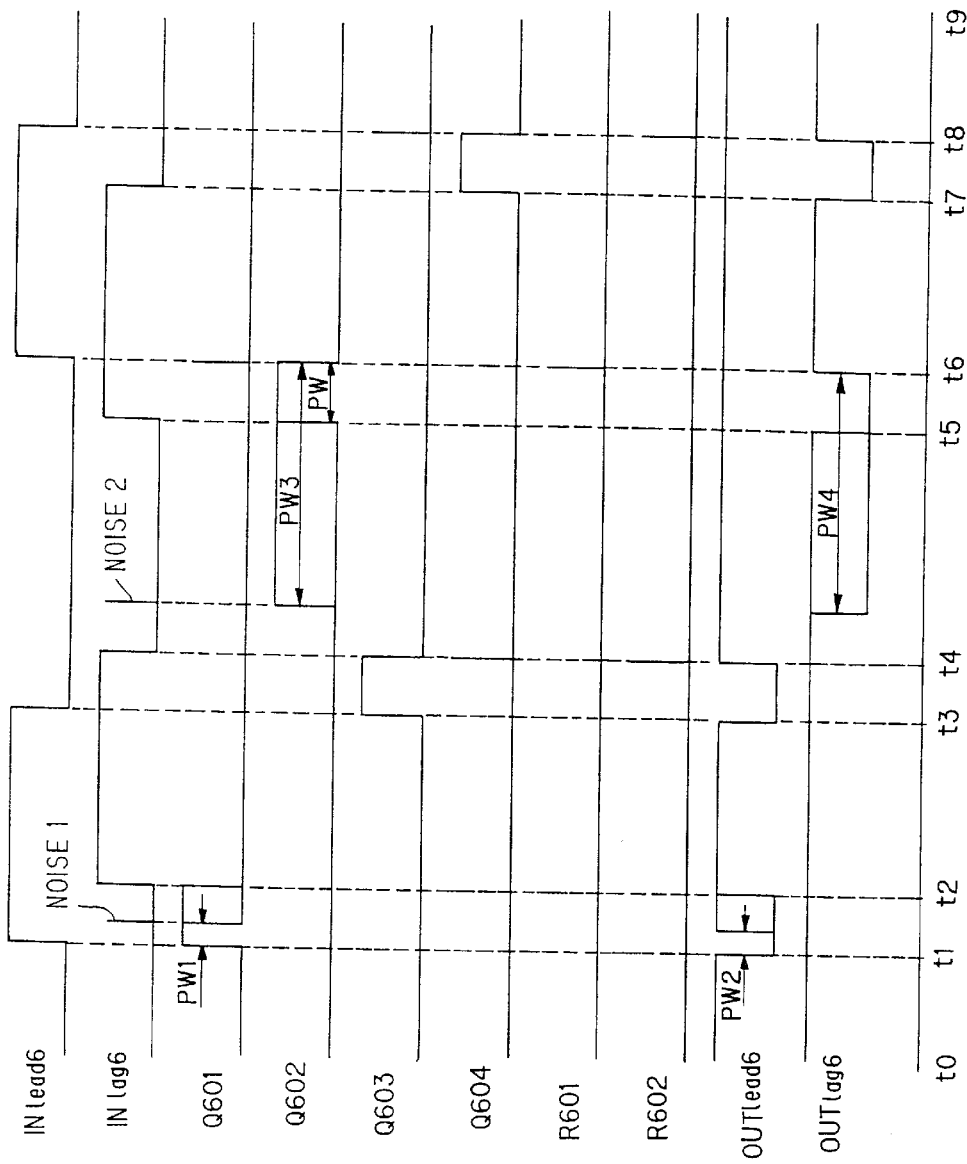
FIG. 3 is a timing chart showing the operation of a conventional phase comparator.
Figure 4:
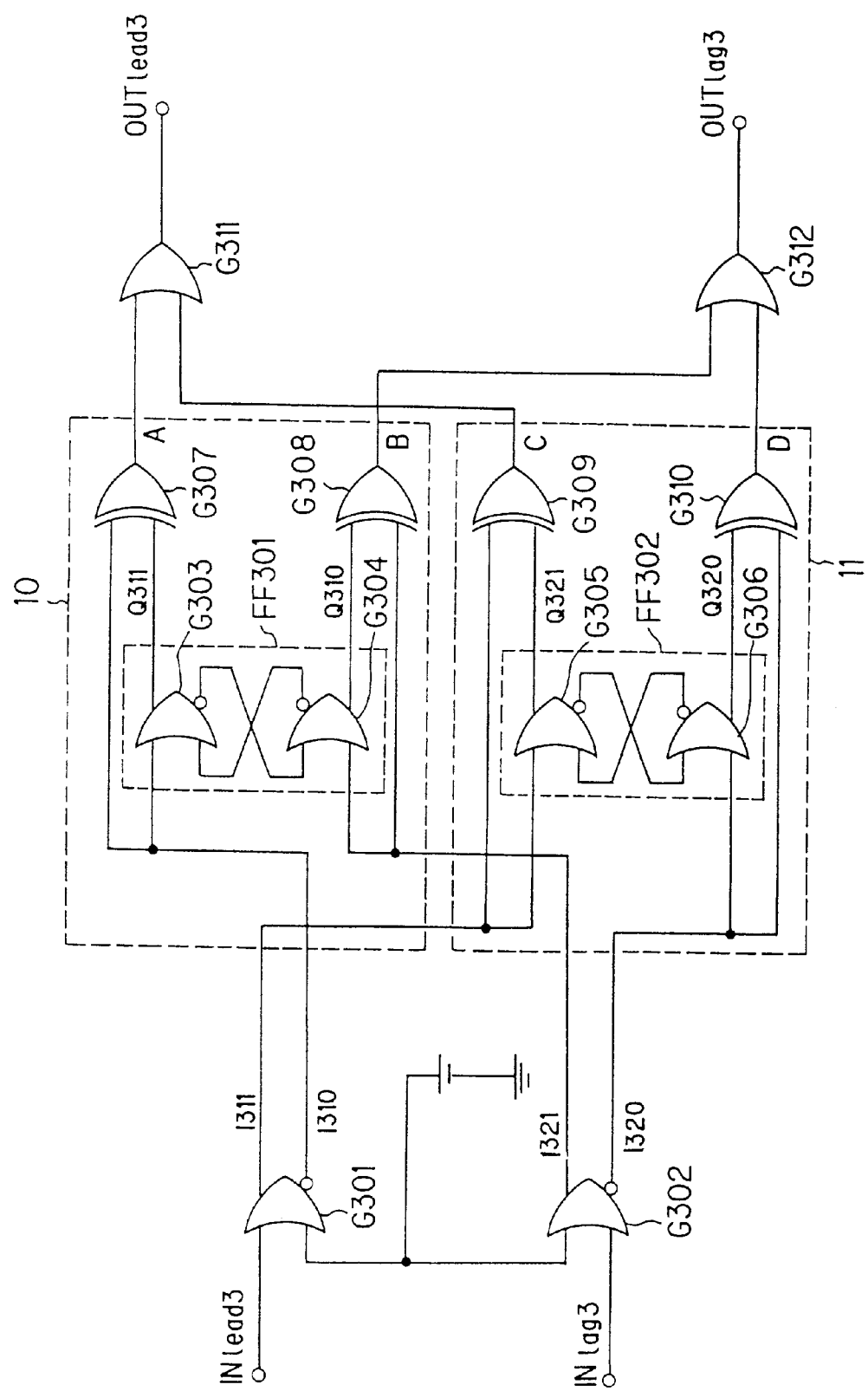
FIG. 4 is a circuit diagram showing one embodiment of a phase comparator in accordance with the invention.

FIG. 4 shows a logic circuit diagram of one embodiment of a phase comparator in accordance with the invention. This circuit diagram is assumed to use ECL circuit configurations.

G301 through G306 and G311 and G312 are OR circuits. G307 through G310 are EX-OR circuits. One input to G301 is connected to a lead-phase input terminal INlead3 and one input to G302 is connected to a lag-phase input terminal INlag3. The other inputs to them are connected to a reference voltage power source which supplies an intermediate potential between the 'H' level and the 'L' level. G301 generates a non-inverted signal I311 of its input and an inverted signal I310 of its input while G302 generates a non-inverted signal I321 of its input and an inverted signal I320 of its input, all the output signals being generated with the same timing.

The advantage of ECL circuit configurations is that the signal delays of two outputs I311 and I310 are approximately the same in the case of G301 of FIG.4, for example. If this gate is formed of a CMOS configuration, one output I311 uses the input signal INlead3 directly and the other output I310 needs to invert the input, which leads to a delay time between the two outputs. An ECL circuit configuration is free from this problem.

G303 and G304, and G305 and G306 form RS flip-flops FF301 and FF302, respectively. The set input to FF301 is connected to I310 and the set input to FF302 is connected to I311. The reset input to FF301 is connected to I321 and the reset input to FF302 is connected to I320. Q311 and Q321 are the non-inverse outputs and Q310 and Q320 are the inverse outputs. Signals I310 and Q311 are the inputs to EX-OR circuit G307, signals I321 and Q310 are the inputs to EX-OR circuit G308, signals I311 and Q321 are the inputs to EX-OR circuit G309, and signals I320 and Q320 are the inputs to EX-OR circuit G310. Here, the portion constituted by FF301, G307 and G308 is termed the first phase comparing portion, the portion constituted by FF302, G309 and G310 is termed the second phase comparing portion. The outputs from EX-OR circuits G307, G308, G309 and G310 are termed A, B, C and D, respectively. The inputs to G311 and G312 are connected to A and C, and B and D, respectively. The outputs from G311 is connected to the output terminal OUTlead3 and the outputs from G312 is connected to the output terminal OUTlag3.

Now, RS flip-flops FF301 and FF302 will be described.

Figures 5, 6:
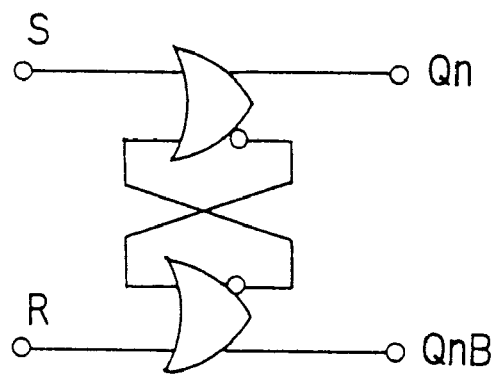
FIG. 5 is a circuit diagram showing an RS flip-flop.
FIG. 6 is an illustrative chart showing the input-output characteristics of the flip-flop.

FIG. 5 is a circuit diagram showing an RS flip-flop of this embodiment, and FIG.6 is a chart for explaining the input-output characteristics of this flip-flop.

The RS flip-flop shown in FIG. 5 consists of two OR circuits. One OR circuit has one input, i.e., the set input (S-input) and the other OR circuit has the other input, i.e., the reset input (R-input), each output being inverted and cross-coupled to the input of the other OR circuit. The two OR circuits output non-inverse output Qn and inverse output QnB. Since the RS flip-flop of this embodiment basically uses gates of OR circuits, the input is positive logic. In general, both the inputs to S and R being 'H (true)' are not allowed. One reason is that in this case, both the noninverse and inverse outputs become 'H (true)', resulting in logical contradiction of assumption. Another reason is that when S and R at this 'H (true)' state simultaneously transit to the 'L' latch state, the resulting output state is unpredictable. In spite of the above situation, there is no problem unless the both S and R are set at the 'H (true)' state and transit to the 'L (false)' state.

Figure 7:
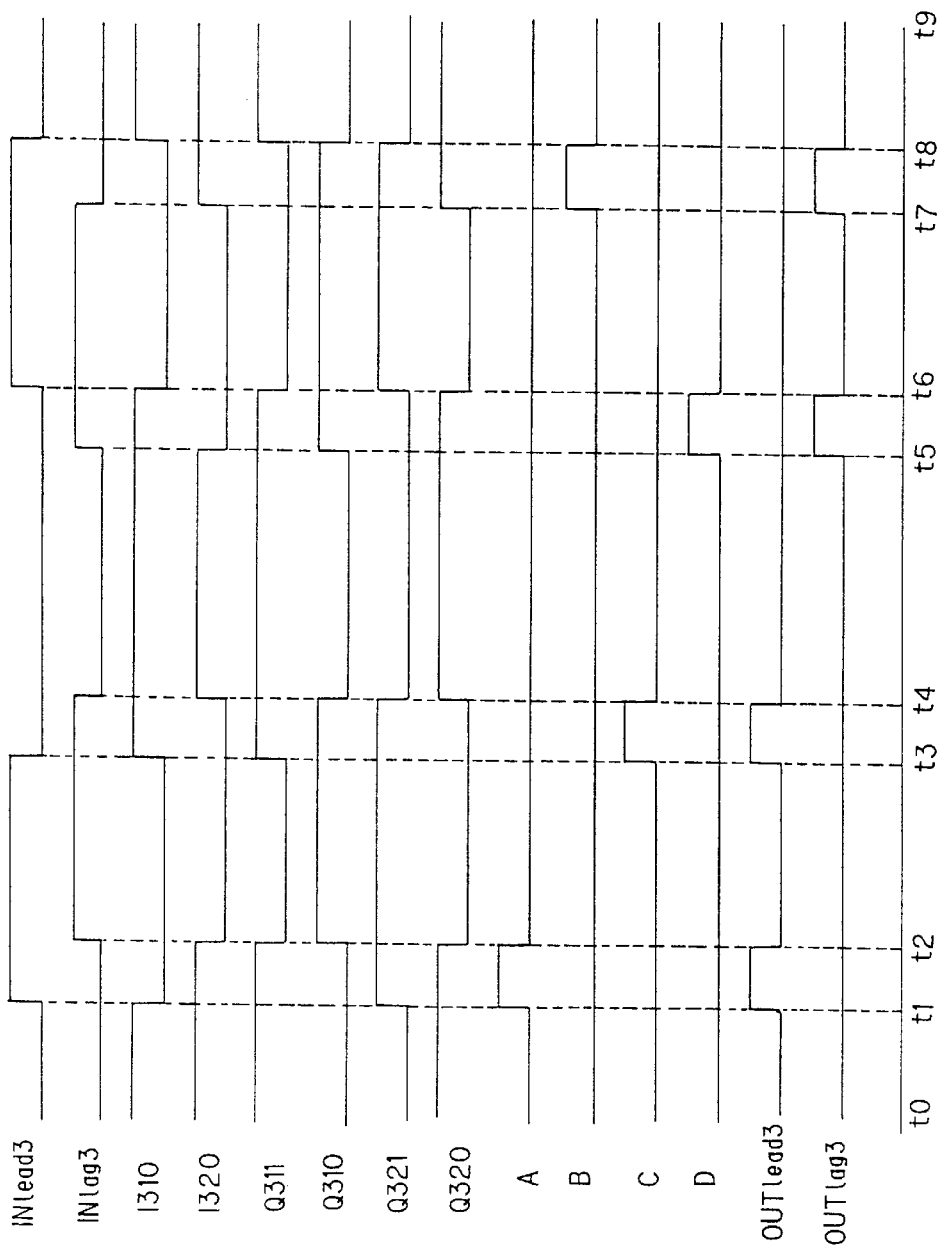
FIG. 7 is a timing chart showing the operation of a phase comparator.

FIG. 7 shows a timing chart of this embodiment. At t0, FF301 is in the set state and FF302 is in the reset state. At t1, FF301 is in the latch state and outputs Q321 and Q320 from FF302 are both in the 'H' state. At t2, FF301 is in the reset state and FF302 is in the set state. At t3, both outputs Q311 and Q310 from FF301 are in the 'H' state and FF302 is in the latch state. At t4, FF301 is in the set state and FF302 is in the reset state. At t5, both outputs Q311 and Q310 from FF301 are in the 'H' state and FF302 is in the latch state. At t6, FF301 is in the reset state and FF302 is in the set state. At t7, FF301 is in the latch state and both outputs Q321 and Q320 from FF302 are in the 'H' state. At t8, FF301 is in the set state and FF302 is in the reset state.

In this arrangement, when the exclusive-OR operations are performed between the non-inverted input and the non-inverse output of flip-flop FF301 and between those of FF302 and between the inverted input and the inverse output of flip-flop FF301 and between those of FF302, the resulting four conditions will provide for the detection of the phase difference. More specifically, in the first phase comparing portion, EX-OR circuit G307 outputs the 'H' state from its output A during only the time between the two first transitions (leading edge) in the leading phase state (1) at the phase difference zone, and EX-OR circuit G308 outputs the 'H' state from its output B during only the time between the two second transitions (trailing edge) in the lagging phase state (2) at the phase difference zone. In the second phase comparing portion, EX-OR circuit G309 outputs the 'H' state from its output C during only the time between the two second transitions (trailing edge) in the leading phase state (3) at the phase difference zone, and EX-OR circuit G310 outputs the 'H' state from its output D during only the time between the two first transitions (leading edge) in the lagging phase state (4) at the phase difference zone.

Then, because of the functions of the OR circuits G311 and G312. when input signal INlead3 leads input signal INlag3, output signal OUTlead3 becomes the 'H' state during only the time between the first transitions (leading edge) of the two input signals and the time between the second transitions (trailing edge) thereof at the difference zone. And, when input signal INlead3 lags behind input signal INlag3, output signal OUTlag3 becomes the 'H' state during only the time between the first transitions (leading edge) of the two input signals and the time between the second transitions (trailing edge) thereof at the phase difference zone.

The reason for detecting the four conditions of phase difference, that is, the first and second transitions (leading edge and trailing edge) for the phase lagging state and the first and second transitions (leading edge and trailing edge) for the phase leading state is that the phase detection result is, in most cases, integrated in an analog manner, for example, to be fed back so as to reduce the phase difference. In this sense, if all the above four conditions can be detected, this contributes to the enhancement of detection sensitivity. Thus, the amount of detection increases and the temporal response speed increases.

Next, a case where a spike noise arises in the input is considered. When the flip-flop is in the 'H' state (i.e., both the inputs to S and R being 'H(true)'), the set state and the reset state, the output from the flip-flops are stable. Therefore, the original state can be returned after a spike noise. However, if a spike noise which will invert the latched state enters one of the two input terminals during a latch state, the original state cannot be returned after the noise. For example, during the period from t1 to t2 in FIG. 7, if a spike noise enters INlag3 terminal, the operation of FF301 is released from the latch state and set into the reset state. As a result, the positive logic pulse from output C becomes short.

In this way, malfunction due to spike noises can be caused only when the flip-flops are in the latch state. Since this only happens during the time of outputting a phase difference signal, spike noises only have an affect on the phase difference signal, shortening its output pulse width. Further, since in most cases, phase difference output is used in a feedback loop, the period of a latch state is relatively very short in the stable state, so this configuration is little affected by spike noises.

Next, a case where the flip-flop transit from the 'H' state (i.e., both inputs to S and R being 'H (true)') to the latch state, is considered. For example, in a case of tracking an optical disc, tracking compensation is performed by using a photo-detector of split sensors and detecting the phase difference between the output signals. Therefore, there is no possibility of the two input signals having a phase difference of 180 degrees or greater. The transition of the state of FF301 from the 'H' state as mentioned above to the latch state only when INlead3 transits from the 'L' state to the 'H' state and INlag3 transits from the 'H' state to the 'L' state, simultaneously. This is the case when the two input signals have a phase difference of 180 degrees. Thus, since the phase difference between the two input signals will not be 180 degrees or greater, there is no circuit operation problems when this configuration is applied to an optical disc tracking correction.

As stated already, the circuit of this embodiment assumes the use of ECL circuit configurations. An ECL circuit uses OR circuits and EX-OR circuits as its basic gates, being configured as a differential amplifier. Therefore, it is possible to output the inverse output and the non-inverse output with the same timing. This embodiment includes four OR gates, two gates for each flip-flop, four other OR gates and four EX-OR gates. Therefore, this configuration can achieve high-speed operation with gate driving current for twelve gates.

As has been described in detail, the phase comparator of the present invention uses no edge triggered flip-flops, and is affected by spike noises for only very short time periods. Further, the phase comparator enables detection of the phase difference between high-speed pulse waveforms with high precision while using ECL circuit configurations, but requires a fewer number of gates in the phase comparator compared to the conventional phase comparator and also can sharply reduce the current consumption.

What is claimed is:

1. A phase comparator comprising:

an RS flip-flop having a set input terminal receiving a first input signal and a reset input terminal receiving an inverted signal of a second input signal, and producing non-inverse and inverse outputs, wherein only when the first input signal and the inverted signal of the second input signal are both logical value true, the non-inverse output and the inverse output also become logical value true;

a first exclusive-OR circuit receiving the first input signal and the non-inverse output and sending a first phase difference output signal; and a second exclusive-OR circuit receiving the inverted signal of the second input signal and the inverse output and sending a second phase difference output signal.

2. The phase comparator of claim 1, wherein a phase comparing portion including the RS flip-flop and first and second exclusive-OR circuits is configured so that any adverse effects of spike noises on the phase comparator are limited in time.

3. The phase comparator of claim 1, wherein said RS flip-flop further includes:

a first OR circuit configured to receive an input signal from said set terminal of the RS flip-flop, and to send a non-inverted output as the non-inverse output of the RS flip-flop, and a second OR circuit configured to receive an input signal from said reset terminal of the RS flip-flop, and to send a non-inverted output as the non-inverse output of the RS flip-flop, while the outputs of each OR circuit are inverted and cross-coupled to the input of the other OR circuit.

4. The phase comparator of claim 3, wherein the first and second exclusive-OR circuits and the first and second OR circuits are formed in an ECL configuration, so as to output both the inverse and non-inverse outputs with the same timing to avoid system delay.

5. A phase comparator comprising:

a first RS flip-flop having a set input terminal receiving an inverted signal of a first input signal and a reset input terminal receiving a second input signal, and producing first non-inverse and inverse outputs, wherein only when the inverted signal of the first input signal and the second input signal are both logical value true, the first non-inverse output and the first inverse output also become logical value true;

a first exclusive-OR circuit receiving the inverted signal of the signal of the first input signal and the first non-inverse output;

a second exclusive-OR circuit receiving the second input signal and the first inverse output;

a second RS flip-flop having a set input terminal receiving said first input signal and a reset input terminal receiving an inverted signal of said second input signal, and producing second non-inverse and second inverse outputs, wherein only when the first input signal and the inverted signal of the second input signal are both logical value true, the second non-inverse output and the second inverse output also become logical value true;

a third exclusive-OR circuit receiving the first input signal and the second non-inverse output;

a fourth exclusive-OR circuit receiving the inverted signal of the second input signal and the second inverse output;

a first OR circuit receiving an output from both the first exclusive-OR circuit and the third exclusive-OR circuit; and, a second OR circuit receiving an output from both the second exclusive-OR circuit and the fourth exclusive-OR circuit.

6. The phase comparator of claim 5, wherein the first and second OR circuits are the only OR circuits to receive outputs from the first or second exclusive-OR circuits.

7. The phase comparator of claim 5, wherein said first RS flip-flop further includes:

a third OR circuit configured to receive an input signal from said set terminal of the first RS flip-flop, and to send a non-inverted output as the non-inverse output of the first RS flip-flop, and a fourth OR circuit configured to receive an input signal from said reset terminal of the first RS flip-flop, and to send a non-inverted output as the non-inverse output of the first RS flip-flop, while the outputs of each OR circuit are inverted and cross-coupled to the input of the other OR circuit.

8. The phase comparator of claim 7, wherein the first and second exclusive-OR circuits and the first and second OR circuits are formed in an ECL configuration, so as to output both the inverse and non-inverse outputs with the same timing to avoid system delay.

9. The phase comparator of claim 5, wherein a first phase comparing portion including the first RS flip-flop and first and second exclusive-OR circuits, and a second phase comparing portion including the second RS flip-flop and third and fourth exclusive-OR circuits, are configured so that any adverse effects of spike noises on the phase comparator are limited in time.

10. The phase comparator claim 5, wherein said second RS flip-flop further includes:

a third OR circuit configured to receive an input signal from said set terminal of the second RS flip-flop, and to send a non-inverted output as the non-inverse output of the second RS flip-flop, and a fourth OR circuit configured to receive an input signal from said reset terminal of the second RS flip-flop, and to send a non-inverted output as the non-inverse output of the second RS flip-flop, while the outputs of each OR circuit are inverted and cross-coupled to the input of the other OR circuit.

* * * * *